(12) United States Patent
Catchpole

(10) Patent No.: US 9,807,876 B2
(45) Date of Patent: Oct. 31, 2017

(54) ELECTRONIC READING DEVICE

(71) Applicant: Flexenable Limited, Cambridge, Cambridgeshire (GB)

(72) Inventor: Mark Catchpole, Prickwillow (GB)

(73) Assignee: FLEXENABLE LIMITED, Cambridge, Cambridgeshire (GB)

(*) Notice: Subject to any disclaimer, the term of this patent is extended or adjusted under 35 U.S.C. 154(b) by 69 days.

(21) Appl. No.: 14/403,157

(22) PCT Filed: May 22, 2013

(86) PCT No.: PCT/GB2013/051344
§ 371 (c)(1),
(2) Date: Nov. 21, 2014

(87) PCT Pub. No.: WO2013/175212
PCT Pub. Date: Nov. 28, 2013

(65) Prior Publication Data
US 2015/0138736 A1 May 21, 2015

(30) Foreign Application Priority Data
May 22, 2012 (GB) .................................. 1209033.8

(51) Int. Cl.
*H05K 1/02* (2006.01)
*G06F 1/16* (2006.01)

(52) U.S. Cl.
CPC ........... *H05K 1/028* (2013.01); *G06F 1/1652* (2013.01)

(58) Field of Classification Search
CPC .............................. H05K 1/028; G06F 1/1652
See application file for complete search history.

(56) References Cited

U.S. PATENT DOCUMENTS

| | | | | |
|---|---|---|---|---|
| 5,177,596 A * | 1/1993 | Muramatsu | .......... | H05K 3/0097 174/254 |
| 5,478,006 A * | 12/1995 | Taguchi | .............. | H01L 23/3107 228/106 |
| 5,986,726 A * | 11/1999 | Murai | ............... | G02F 1/133308 349/58 |

(Continued)

FOREIGN PATENT DOCUMENTS

| | | |
|---|---|---|
| CN | 102201175 A | 9/2011 |
| DE | 20 2010 008706 U1 | 1/2011 |

(Continued)

OTHER PUBLICATIONS

International Search Report and Written Opinion dated Apr. 29, 2014 for International Application No. PCT/GB2013/051344.

(Continued)

*Primary Examiner* — Nathan Milakovich
(74) *Attorney, Agent, or Firm* — Knobbe Martens Olson & Bear, LLP

(57) ABSTRACT

A flexible electronic reading device, the device comprising a display part and a handle, wherein said display part comprises: a display backplane on a flexible substrate; and a display mounted over said display backplane; wherein said handle is located at one edge of said display backplane and contains display interface electronics for said display; and wherein said display part of said electronic reading device comprises a unitary, continuous structure lacking a separate housing.

7 Claims, 9 Drawing Sheets

(56) References Cited

U.S. PATENT DOCUMENTS

| | | | | |
|---|---|---|---|---|
| 6,118,665 | A * | 9/2000 | Kishida | H05K 3/361 |
| | | | | 174/117 F |
| 7,408,263 | B2 * | 8/2008 | Meth | H01R 4/04 |
| | | | | 257/783 |
| 8,207,947 | B2 * | 6/2012 | Marsh | G06F 1/1626 |
| | | | | 178/18.03 |
| 9,195,358 | B1 * | 11/2015 | Cok | G06F 3/044 |
| 9,307,061 | B2 * | 4/2016 | Nikula | G06F 1/1626 |
| 2003/0227441 | A1 | 12/2003 | Hioki et al. | |
| 2006/0146488 | A1 | 7/2006 | Kimmel | |
| 2006/0229117 | A1 * | 10/2006 | Lehtonen | H04M 1/0212 |
| | | | | 455/575.3 |
| 2006/0242556 | A1 | 10/2006 | Koshimizu et al. | |
| 2007/0247792 | A1 * | 10/2007 | Yang | G06F 1/1616 |
| | | | | 361/679.27 |
| 2008/0055303 | A1 * | 3/2008 | Ikeda | G06F 1/1601 |
| | | | | 345/214 |
| 2008/0297496 | A1 * | 12/2008 | Watson | G06F 1/1601 |
| | | | | 345/206 |
| 2009/0000169 | A1 * | 1/2009 | Houssain | G09F 15/0068 |
| | | | | 40/605 |
| 2009/0113291 | A1 * | 4/2009 | Barclay | G06F 3/03547 |
| | | | | 715/243 |
| 2010/0060563 | A1 * | 3/2010 | Hayton | G06F 1/181 |
| | | | | 345/107 |
| 2010/0277443 | A1 | 11/2010 | Yamazaki | |
| 2013/0107476 | A1 * | 5/2013 | Wright | G09G 3/3208 |
| | | | | 361/752 |
| 2014/0073074 | A1 * | 3/2014 | Von Werne | G02F 1/133305 |
| | | | | 438/34 |
| 2014/0098075 | A1 * | 4/2014 | Kwak | G06F 3/0487 |
| | | | | 345/204 |
| 2015/0192953 | A1 * | 7/2015 | Meyers | B32B 37/14 |
| | | | | 455/575.8 |
| 2015/0198978 | A1 * | 7/2015 | Catchpole | G06F 1/1632 |
| | | | | 345/173 |
| 2015/0277496 | A1 * | 10/2015 | Reeves | G06F 1/1641 |
| | | | | 345/1.2 |
| 2015/0351232 | A1 * | 12/2015 | Cok | H05K 1/028 |
| | | | | 156/204 |
| 2016/0048167 | A1 * | 2/2016 | Aurongzeb | G06F 3/02 |
| | | | | 361/679.26 |

FOREIGN PATENT DOCUMENTS

| | | | | |
|---|---|---|---|---|
| GB | 2378034 A | | 1/2003 | |
| GB | 2380824 A | * | 4/2003 | G06F 1/1616 |
| GB | 2 454 030 A | | 4/2009 | |
| JP | 2012 048094 A | | 3/2012 | |
| WO | 03/034137 A2 | | 4/2003 | |
| WO | 2007/144549 A1 | | 12/2007 | |
| WO | 2010/041227 A1 | | 4/2010 | |
| WO | 2010/128616 A1 | | 11/2010 | |

OTHER PUBLICATIONS

International Search Report and Written Opinion dated Nov. 25, 2014 for International Application No. PCT/GB2013/051344.
Search Report received in Great Britain Patent Application No. GB1209033.8 dated Apr. 30, 2013 in 2 pages.
Great Britain Examination Report dated Oct. 28, 2014 for Application No. GB1209033.8.

* cited by examiner

ELECTRONIC READING DEVICE

CROSS-REFERENCE TO RELATED APPLICATIONS

This application is the U.S. National Phase under 35 U.S.C. §371 of International Application No. PCT/GB2013/051344, filed May 22, 2013, designating the United States and published in English on Nov. 28, 2013 as WO 2013/175212, which claims priority to United Kingdom Application No. 1209033.8, filed May 22, 2012.

FIELD OF THE INVENTION

This invention relates to improvements in flexible electronic reading devices ('E-readers').

BACKGROUND TO THE INVENTION

Background prior art relating to electronic document reading devices can be found in U.S. Pat. No. 6,124,851, US2004/0201633, US2006/0133664, US2006/0125802, US2006/0139308, US2006/0077190, US2005/0260551, U.S. Pat. No. 6,124,851, U.S. Pat. No. 6,021,306, US2005/0151742, and US2006/0119615. Examples of electronic document reading devices are the Iliad Ilex®, the Amazon Kindle® and the Sony® Reader. Background prior art relating to power saving can be found in: US2007/0028086, US2007/0115258, and U.S. Pat. No. 7,058,829.

We have previously described electronic document reading devices using an electrophoretic display with a flexible or flex-tolerant backplane based on plastic (solution-deposited) electronics, for example in our earlier applications WO2007144549, WO2009053743, WO2009053740 and WO2009053747. Various further improvements in eReaders are described in our patents/applications US2010-0066685; WO/2011/048424; WO/2009/053738; GB2446499; GB2446500; GB2446302; and GB2458106. We have also described electronic reading device touch screen technology in, for example, WO2007/012899 and WO2011/036492.

We have also described techniques for fabricating thin, flexible, large-area displays, in particular using a plastic active matrix backplane bearing organic thin film transistors, which may be configured to drive, for example, an electrophoretic display. Some representative examples of such case are WO2007/144549; WO 2006/059162; WO 2006/056808; WO 2006/061658; WO 2006/106365; and WO 2006/129126.

We are here particularly concerned with improvements to the user-experience of devices of this general type.

SUMMARY OF THE INVENTION

According to the present invention there is therefore provided a flexible electronic reading device, the device comprising a display part and a handle, wherein said display part comprises: a display backplane on a flexible substrate; and a display mounted over said display backplane; wherein said handle is located at one edge of said display backplane and contains display interface electronics for said display; and wherein said display part of said electronic reading device comprises a unitary, continuous structure lacking a separate housing.

Broadly speaking in embodiments of the invention the combination of the display and backplane are integrally formed in the sense that that they constitute a continuous, one-piece structure from which the various components cannot be non-destructively separated. There is no separate housing for the display and backbone (although there is a handle along one edge).

In embodiments of the invention the combination of the display and backplane themselves provide sufficient stiffness for the device to be self-supporting when held by the handle and essentially the entire device is fabricated on the flexible, plastic substrate of the display backplane. This is, in embodiments, extended beyond the border of the display on at least three sides and used to mount the display interface electronics, using chip-on-plastic technology, and to run the tracks to the display drive electrodes around the edges of the display. Thus in embodiments there is no internal or external stiffening frame for the device and no rigid front panel (although there may be a thin, for example less 100 µm, protective front layer over the display).

In embodiments the display interface electronics includes a plurality of pixel driver chips, which are mounted in the handle, preferably on an extension of the plastic substrate. In embodiments these include at least one gate driver chip and at least two source/drain driver chips, one of the source/drain driver chips driving a set of data lines extending from each edge of the display (in a direction generally parallel to the handle). In embodiments of the device which include a touch sensitive screen, for example a projected capacitance touch sensitive screen, a similar technique may be employed to connect to either end of the line of a touch sensing track. This is because the indium tin oxide (ITO) tracks are relatively resistive and thus by connecting to either end of the track line, with an electrical break in the middle of the track, and providing a separate touch sensing chip for each end of the track, finer lines and hence more accurate touch sensing may be implemented on larger area displays.

In preferred embodiments the lateral extension of the plastic substrate beyond the display edge is concealed by a border of the electronic reading device, which may comprise an opaque region around the border of the display behind the transparent front protective layer (except where a handle is located).

In other embodiments the tracks to the display drive electrodes around the edges of the display may be run behind the display area and the display may be substantially borderless.

In some embodiments a rechargeable battery for the display is located within the handle, which because the remainder of the display is light, facilitates one-handed user operation. More particularly in such embodiments the centre of mass of the device may then be located within a lower part of the device, at a distance of no greater than 50%, 33%, 20%, 15% or 10% from the lower end of the device. Optionally the centre of mass of the device may be located substantially adjacent a user control in the handle. Such an arrangement further facilitates one-handed user operation.

In other embodiments the battery may comprise a thin-film flexible battery such as a polymer battery, and this may extend over a majority, optionally substantially all the rear surface of the device. In this way a relatively large capacity battery may be 'concealed' as part of the device. In embodiments the device includes a flexible printed circuit board (PCB) behind the display backplane. Then components on the PCB may be laterally arranged over a first region behind the backplane surface and the flexible battery may be located in a second, non-overlapping region. In some preferred embodiments the device includes an inductive loop to receive power for charging the rechargeable battery; this may extend around the border of the device, for example concealed by the opaque border region.

In embodiments the display may be monochrome or colour. The display may be an electrophoretic display or an electrofluidic display; in some preferred implementations the display is a colour electrofluidic display. In some preferred embodiments the display includes a touch-screen layer on a front surface, for example to operate with a stylus or a finger; this may be projected capacitance touch sensing layer or an inductive stylus sensing layer. In embodiments the touch sensing/screen layer is laminated to the front of the display; optionally, but not necessarily, a thin transparent protective film may be provided over the front surface, for example having a thickness less than 0.5 mm, 0.3 mm, 0.2 mm or 0.1 mm. In some preferred embodiments the touch-screen is combined with the protective film in a single layer.

Although embodiments of the device include a handle along one edge, this is not essential, and a self-supporting device may be fabricated as a unitary structure.

Thus in a related aspect the invention provides a flexible electronic reading device, the device comprising: a display backplane on a flexible substrate; a display mounted over said display backplane; and display interface electronics for said display, coupled to said display backplane; wherein said display backplane comprises active matrix pixel driver circuitry on a plastic substrate; wherein said plastic substrate extends beyond a border of said display; and wherein at least a portion of said display interface electronics is fabricated on said plastic substrate.

In embodiments the plastic substrate extends beyond the border (active area) of said display on one or more sides, and one or more pixel driver chips are mounted on these extended sides of the plastic substrate using chip-on-plastic technology (although other embodiments lack such a border). In embodiments the plastic substrate extends beyond the border of the display on four sides. In addition a flexible printed circuit board (PCB) is joined by adhesive to the backplane and the backplane is connected to the PCB by vias which run through to a display side of the backplane. The vias connect to anisotropic conductive film located in the adhesive layer.

These approaches facilitate a unitary, continuous structure for the device, which then does not require any separate housing. This in turn substantially reduces the thickness of the device. In embodiments a rear surface of the device is substantially completely flat up to one, three, or all four edges of the device.

Some embodiments of the electronic reading device provide a hinged display, for example comprising at least one hinge running in parallel to the handle to enable one portion of the display to be folded behind another. For example the unfolded display may have substantially an A4 or similar size, with the handle at the bottom. Then the top half of the display may be folded behind the lower half of the display to provide an approximately A5 size display; Optionally this may then be held in portrait mode with the handle at the left or the right. Optionally the orientation of the device may be detected automatically, for example by means of an accelerometer or the like.

In other embodiments the one or more hinges may run perpendicular to a handle along a bottom edge of the display and one or more flaps of the display may fold along a vertical line. In this case the handle may also be foldable (or may be shorter than the full width of the display, so that it does not run across a hinge "break").

In some embodiments the display may be Z-foldable, that is having one mountain fold and one valley fold so that, when folded, one part of the display is located between two adjacent regions of the display. This may be implemented, for example, by providing three display screen hingedly connected to one another.

Where the display incorporates a hinge, this can conveniently be combined with embodiments in which electrode lines running perpendicular to the hinge direction are broken across a line of the hinge and driven from opposite edges of the display, as previously described. Either the gate or the drain/source lines may be broken but since the drain/source lines carry greater current in embodiments these are driven from either edge of the display, for example by separate driver chips. Thus, for example, where the handle runs along the bottom of the display and the hinge is parallel to the handle one set of drain/source lines may run upwards between the handle and the hinge and a second set of drain/source lines may run downwards from an upper edge of the display towards the hinge, the extended border of the flexible substrate being employed to run tracks around the edge of the display to drive the upper set of drain/source lines from the top. Although the display hinge will hinge the flexible border of the substrate carrying the tracks as well as the display itself, it is relatively straightforward to provide a set of jumpers, for example on a flexible PCB, to maintain an electrical connection when the display unit Is in its hinged state. Alternatively these tracks at the border of the display may simply be broken when the display is in its hinged configuration since, at that point, the hinged away portion of the display is not needed. In this latter case a set of contacts may be provided such that when adjacent portions of the flexible substrate are hinged flat to define the full sized display. Contacts on the track of one portion of the display may abut against corresponding contacts on the second portion to make the electrical connection. The skilled person will appreciate that alternative approaches may also be employed. It will further be appreciated that although, for convenience, a description has been given of a display in which the upper portion folds behind the lower portion, equally a left portion could fold behind a right portion of the display or vice-versa, or there may be multiple hinges provided, for example to allow the display area to be reduced by one third, two thirds, three-quarters and so forth. Similarly where one set of mutually perpendicular electrode lines for driving a display is broken at the hinge, it is not necessary to orientate the hinge so that the drain/source lines are broken and, for example, gate lines may be broken. Alternatively jumper connections may be provided as previously described so that no connections are broken at the point of hinging.

In preferred implementations the display interface electronics also includes electronics for a wireless link to a second electronic device. Such a device may be, for example, a laptop or desktop computer, a PDA (personal digital assistant), a mobile phone, in particular a Smartphone, or other such devices. The wireless interface may be a radio frequency interface, for example a WiFi or Bluetooth™ interface or an optical, for example infra-red, interface. This enables documents and the like to be transferred to the electronic reader for display and optionally back from the electronic reader, for example where allocated by the user. (Here 'document' is used broadly to include not just words on a page but also, for example, images, video, web pages, music and so forth).

In some preferred implementations the wireless link electronics includes a processor coupled to memory and stored processor control code. The control code is configured to receive and process print data from an output of a printer driver of the second electronic device. Then to display a documents the device may merely be provided with what appears to an application on the second electronic device to be a conventional printer driver but which is in fact a communications link to the electronic reading device. The electronic reading device receives this print data which it stores and processes for display, in embodiments as if the display were a printed page. This provides a convenient method of interfacing to the device, although other hardware/software interfaces may in general also be provided—for example to accept various types of document and image data such as PDF (portable document format) data, markup language data and the like.

In a related aspect the invention provides a method of manufacturing a flexible electronic reading device, the method comprising: providing an active matrix display backplane on a plastic substrate; mounting a display on said display backplane; providing a handle at one edge of said display backplane, wherein said handle contains display interface electronics for said display; the method further comprising: configuring said combination of display and display backplane to be self-supporting when held by said handle without providing a separate casing for said display and display backplane.

The invention also provides a method of manufacturing a flexible electronic reading device, the method comprising: providing an active matrix display backplane on a plastic substrate; mounting a display on said display backplane; attaching a flexible PCB behind said matrix display backplane; locating a flexible battery on a region of said flexible PCB; providing an inductive charging loop for said battery; providing a front window for said display; providing a rear cover for said device; encapsulating the assembly to provide a self-supporting, integrally formed, unitary flexible electronic reading device.

BRIEF DESCRIPTION OF THE DRAWINGS

These and other aspects of the invention will now be further described, by way of example only, with reference to the accompanying figures in which.

DETAILED DESCRIPTION OF PREFERRED EMBODIMENTS

Figure 1:
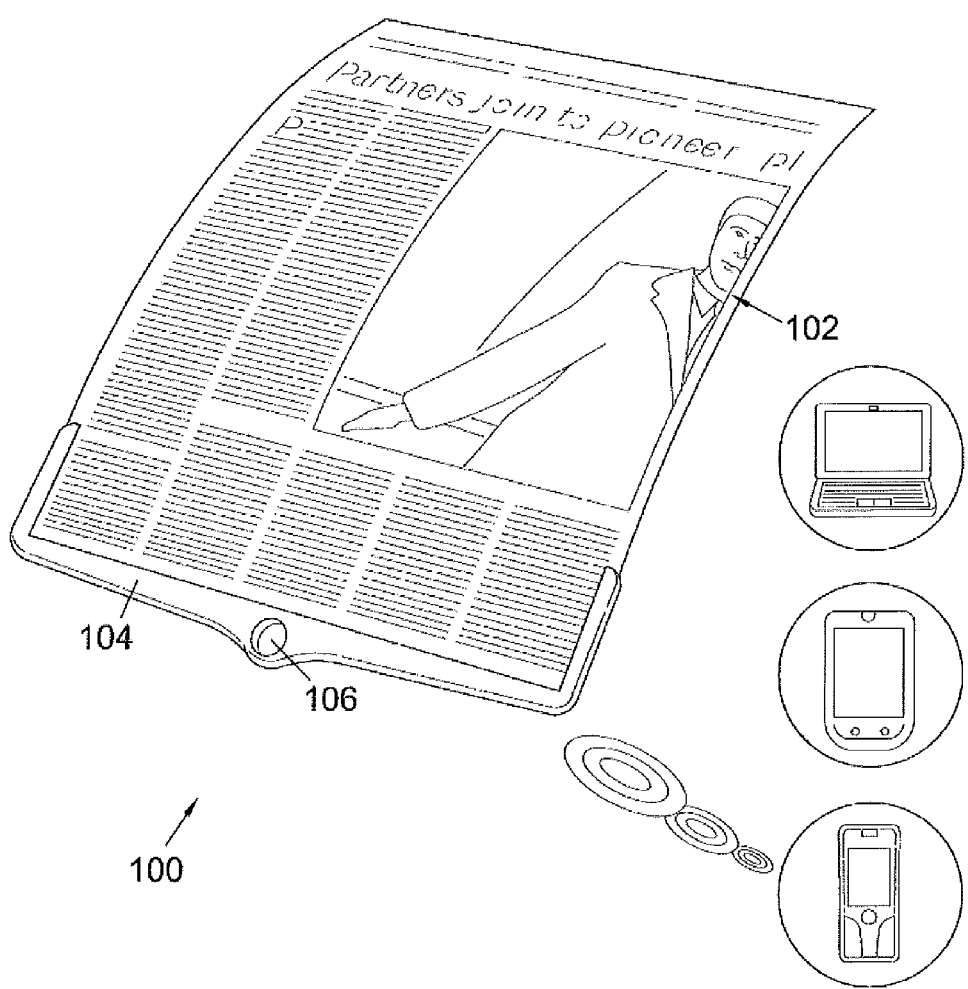
FIG. 1 shows a schematic illustration of an electronic reading device according to a first embodiment of the invention.

Referring to FIG. 1, this shows a first embodiment of an electronic reading device 100 comprising a display part 102 and a handle 104 located at one edge of the display. New display part 102 is flexible and self-supporting when held by the handle, but the device lacks an internal stiffening frame and instead relies upon the structure of the device itself to provide sufficient support. This is facilitated by the device being very thin, in embodiments less than 3 mm thick, and very light, in embodiments less than 200 grams (facilitated by the device being constructed mainly of plastic, including at least some of the functional electronic components of the device). In embodiments the device is sealed and waterproof and has no physical external connections (power and communications are both exclusively wireless).

In embodiments the device has no separate housing or enclosure; instead the device or at least substantially the entirety of the display part of the device has a continuous, unitary structure which is integrally formed. Thus in embodiments substantially all internal voids are filled with a gel-based encapsulation material, and the device is sealed around the edge in a similar manner. Furthermore embodiments of the device lack a bezel around the edge of the device, or at least around the edge of the display part of the device, facilitating flexibility and also foldability because the display portions in foldable embodiments may then be stacked neatly behind one another. A flexible, and in embodiments foldable device is further facilitated by the use of very thin battery technology, as described later.

The screen is preferably touch sensitive although a single user control 106 may also be provided. This may, for example, comprise a refresh button that automatically refreshes data stored within the device via a wireless internet connection, for example one or more RSS (Really Simple Syndication) feeds via the internet.

As described further later, embodiments of the device may be configured to function as a 'viewer' for other electronic devices including, but not limited to: a laptop or desktop computer, a PDA (personal digital assistant), a mobile phone or smartphone, or the like. Thus in embodiments the electronic reading devices provided with wireless interfaces such as an infra-red or Bluetooth™ interface and/or a WiFi or similar interface. Embodiments of the device are configured to enable it to be used as a second screen or the primary screen of the 'host' electronic device.

In embodiments the display gives the appearance of paper. Optionally the device may be configured so that it appears to the host device as a conventional, paper-based printer—for example enabling a document to be displayed on the device by opening the document and clicking print. This can be achieved by providing an appropriate printer driver for the host device (for example as described in our WO2009/053738) and providing corresponding software on the document reading device. In embodiments the display may be borderless, to enhance the impression of 'electronic paper'. Alternatively the display may have the appearance of being borderless by cropping the margins of an image to be displayed and then arranging for the border of the electronic reading device to give the appearance of the margins so that, when displayed, the document page appears, to a viewer, to extend substantially to the edges of the device. Thus in embodiments the borders of the device are coloured to match a white paper background. Where borders are present they may be for example of width around 1 cm and extend to all the edges of the device (optionally excluding the handle part) and internal colouring is employed at a corresponding depth within the device to the active display media to reduce any visual discontinuity at the boundary of the active display region.

Figure 2:
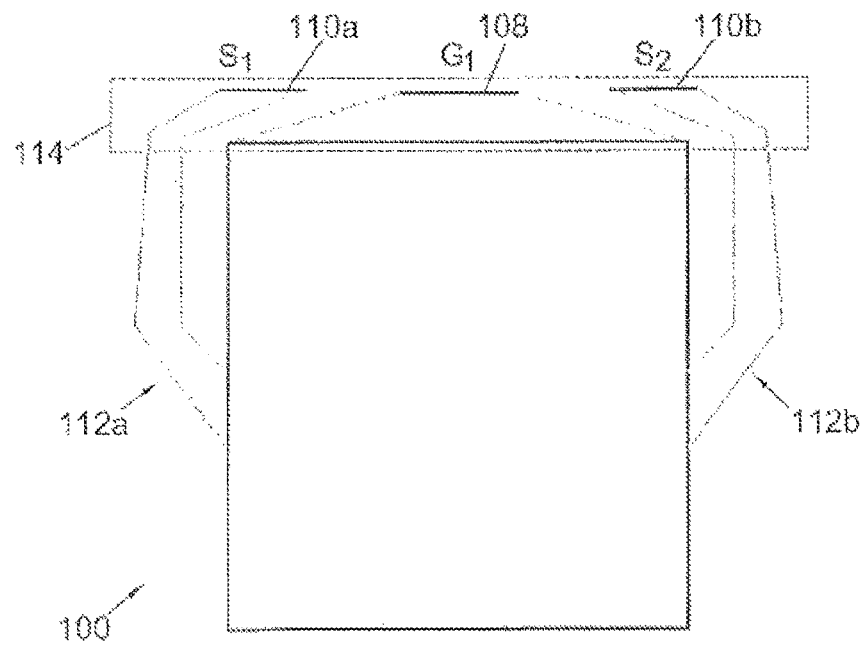
FIG. 2 shows, schematically, connections to display interface electronics for the device at FIG. 1.

FIG. 2 shows an internal arrangement of the display interface electronics for the device at Figure one. In the device at FIG. 1 the control electronics for the device are concealed within handle 104. This includes display driver integrated circuits for the display, which may be an electrophoretic display or electrofluidic display. As illustrated in FIG. 2 the display interface electronics comprises a gate driver integrated circuit 108 and first and second source driver integrated circuits 110a, b. In embodiments the source lines of the display are driven from opposite edges of the display and the gate lines are driven from the handle edge of the display, and thus connections 112a, b between the source driver lines of the display backplane and the source driver integrated circuits 110a, b run along edges of the display portion 102, concealed under a thin border as previously described. The remainder of the device electronics, comprising communications, a micro controller, memory and so forth, may be mounted on a strip of printed circuit board within handle 104. There are no physical sockets for the device, and therefore handle 104 may be very thin. A battery for the device may either be distributed over part or all of the region of display part 102 or located within handle 104. Optionally handle 104 is foldable, which may be achieved by dividing the components between two parts within the handle connected by a flexible connector, for example a portion of flexible printed circuit board. In embodiments the user experience is that holding the device feels like merely holding just the display.

Figure 3A:
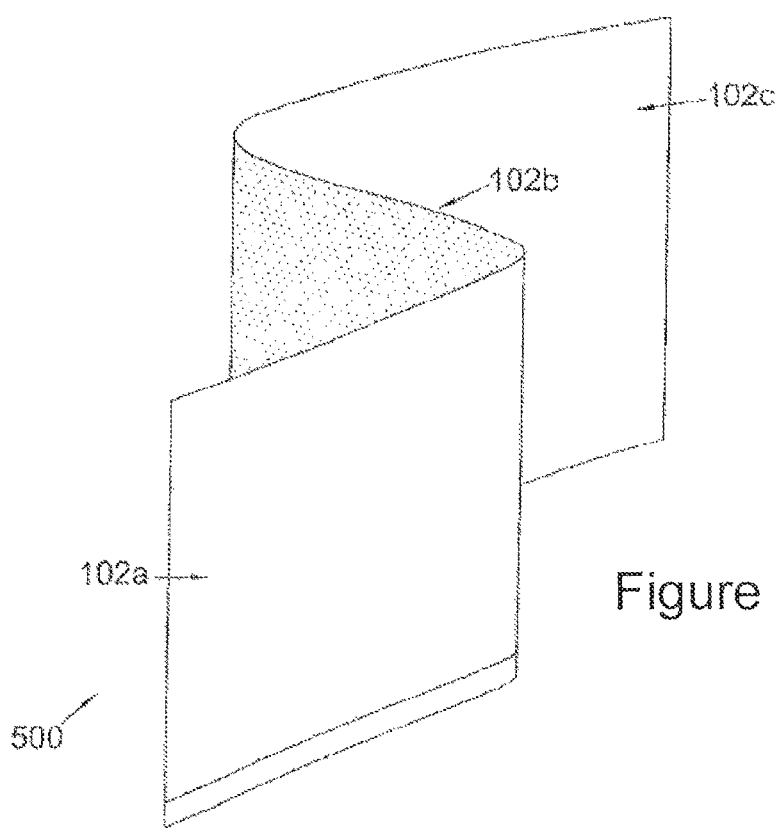
FIGS. 3A and 3B show, schematically, a folding version of the device at FIG. 1.
Figure 3B:
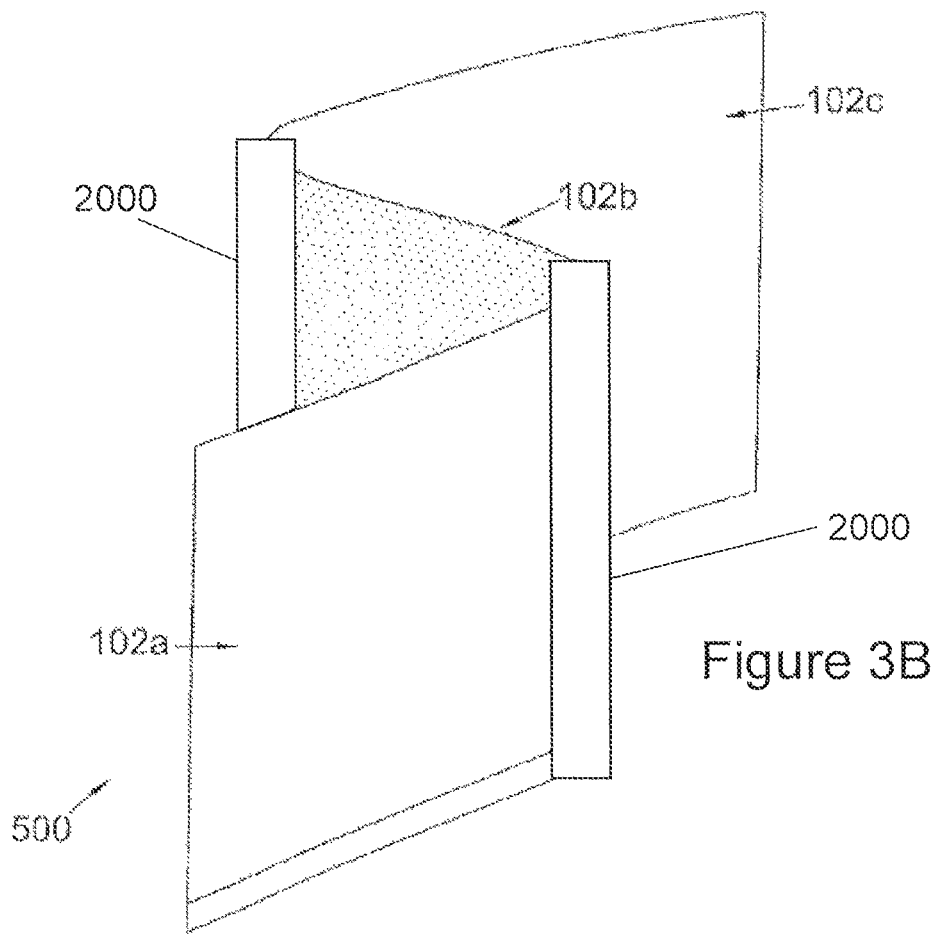

Referring next to FIGS. 3A and 3B, these show a foldable embodiment of the device 100 of FIG. 1 in which, in this example, the display stack comprises three portions 102a, b, c which may be folded so that display portions 102b, c are behind portion 102a. This facilitates changing between, for example, an A4/US letter format and a column format, for example having a width:height aspect ratio of greater than one:two—which is convenient for one-hand reading of documents and other material. In embodiments the vertical hinges (e.g., hinges 2000) may be provided by interlocking formations on abutting edges along either side of the hinge, optionally pulled together by an elastic material lying across the hinge. Electrode lines across the hinge may be broken or, where these are continuous across the hinge, a flexible coupling such as flexible PCB may be employed.

Figure 4:
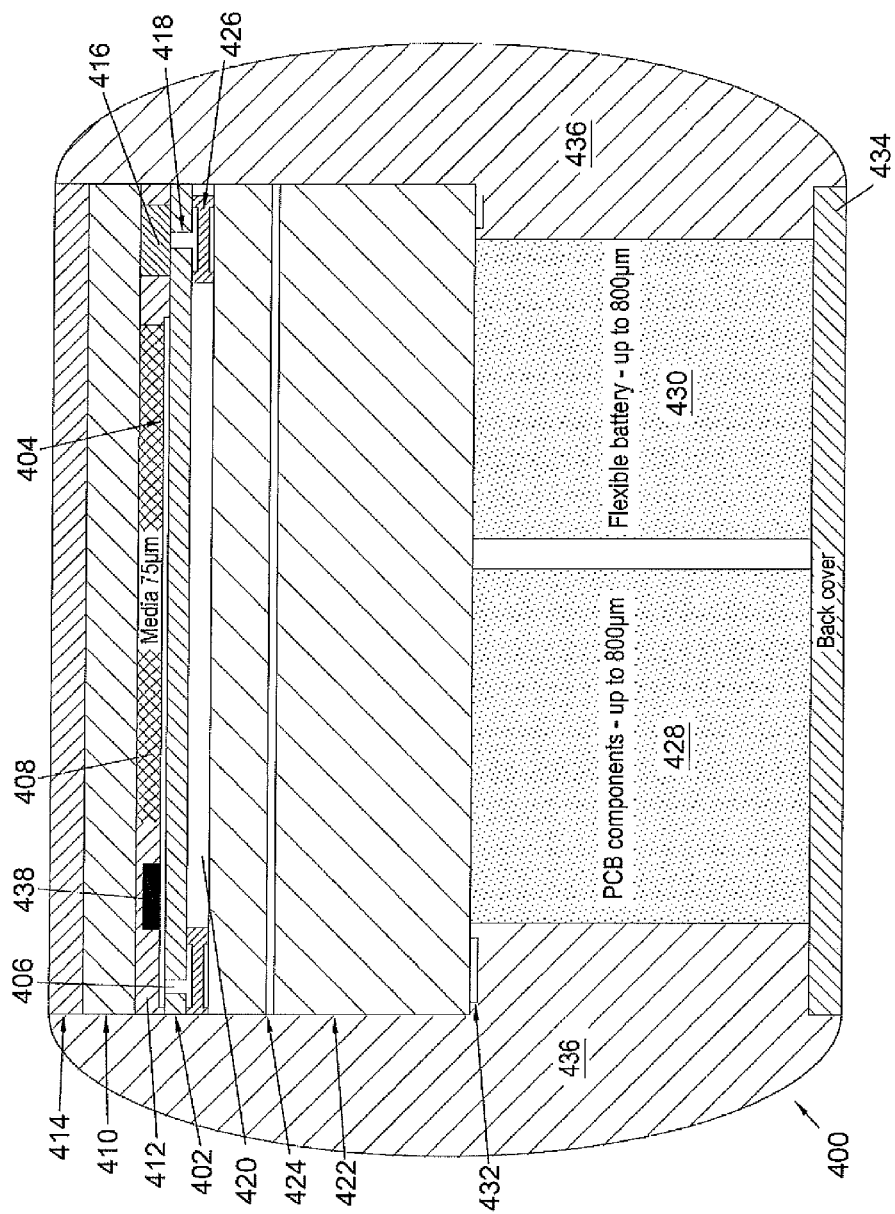
FIG. 4 shows a detailed vertical cross-section view through a second embodiment of an electronic reading device according to the invention.

Referring now to FIG. 4, this shows a vertical cross-section view through a second embodiment of an electronic reading device 400 in which electronic components of the device are distributed over a surface of the device on a flexible PCB. Nonetheless a display stack of the type illustrated in FIG. 4 may also be employed for the embodiment of FIG. 1.

In more detail, the structure comprises a substrate 402, typically a plastic such as PET (polyethyleneterephthalate) or pen(polyethelenemaphthalene) on which is fabricated a thin layer of organic active matrix pixel circuitry. The circuitry may comprise an array of organic (or inorganic) thin film transistors for example as previously described in our WO01/47045, WO2004/070466, WO01/47043, WO2006/059162, WO2006/056808, WO2006/061658, WO2006/106365 and WO2007/029028. Broadly speaking in embodiments the backplane is fabricated using solution based techniques patterned by, for example, direct-right printing, laser ablation or photolithography to fabricate the thin film transistors. In embodiments the active devices have a thickness of order 5-10 µm. In embodiments this layer has a thickness of order 50 µm and has integrated encapsulation. This substrate/backplane layer bears row and column, dataline and address conductive tracks 404, connected to the rear of substrate 402 by vias 406. We here refer to front as being towards the display surface of the device and rear as being towards the rear of the device.

A display medium 408 is attached to substrate 402, for example by adhesive. In preferred embodiments the display medium is a reflective display medium (which facilitates daylight reading), for example an electrophoretic display medium or an electrofluidic display medium. Where an electrophoretic display medium is employed a colour display may be provided by providing a colour filter array 410 over the display medium; optionally this may also perform an encapsulation function. Additionally or alternatively a moisture barrier may be provided over the display, for example comprising polyethylene and/or Aclar™ (a fluoropolymer, polychlorotrifluoroethylene-PCTFE). In some embodiments the thickness of the display medium is of order 75 µm and that of the encapsulation/colour filter array of order 120 µm.

Where an electrofluidic display is employed, for example of the type available from Gamma Dynamics, Inc. Ohio USA, the colour filter array may be omitted. The use of an electrofluidic display facilitates improved brightness/contrast as well as near video display update rates and high resolution, in embodiments of order 225 pixels per inch.

In embodiments whichever display medium is employed, an edge seal 412 is provided to seal the edge of display medium 408 to the edge of the display module.

A front window 414 is provided over the display, for example comprising a thin layer of PMMA (polymethylmethacrylate), in embodiments with a thickness of order 75 µm. Where the device is touch sensitive, this layer may also include conductive row and column lines for the touch circuitry, in embodiments employing fine line metal (FLM). The touch sensing circuitry may be operable by finger and/or a stylus. A connection to the touch sensing layer may be made by a Z-axis conductive pad 416 which connects to the touch electrodes in window 414 through CFA/encapsulation layer 410 (for example by vias, not shown) and vias 418 through substrate 402 bring the touch array connections to contact pads on the rear of substrate 402.

An adhesive layer 420 connects the substrate 402 to a flexible PCB 422 (which may incorporate circuitry 424 for an inductive stylus sensor. Connections between the contact pads on the rear of substrate 402 and the flexible PCB employ an isotropic conductive film (ACF) 426. The illustrated structure facilitates the omission of a separate moisture barrier under substrate 402, although such a barrier may be incorporated if desired.

Flexible PCB 422 carries electronic components 428, for example surface mounted components, and a thin film flexible polymer battery 430. In embodiments the PCB 422 has a thickness of order 600 µm, and the components/battery have a thickness up to 800 µm. Flexible PCB 422 also bears a conductive loop 432 around the border of the device for inductive charging of battery 430.

The components and battery are provided with a thin rear cover 434 (optional). The display and PCB module is encapsulated, for example by a gel-based potting material or encapsulant 436 which, in embodiments, fills all the internal gaps, extending around the edge of the display module, over the flexible PCB, and attaching rear cover 434.

Like the embodiment of FIGS. 1-3, the display may be foldable in half or in thirds. In embodiments the device entirely lacks mechanical controls and, in embodiments, all connections to the device are wireless; embodiments of the device lack speakers.

Figure 5:
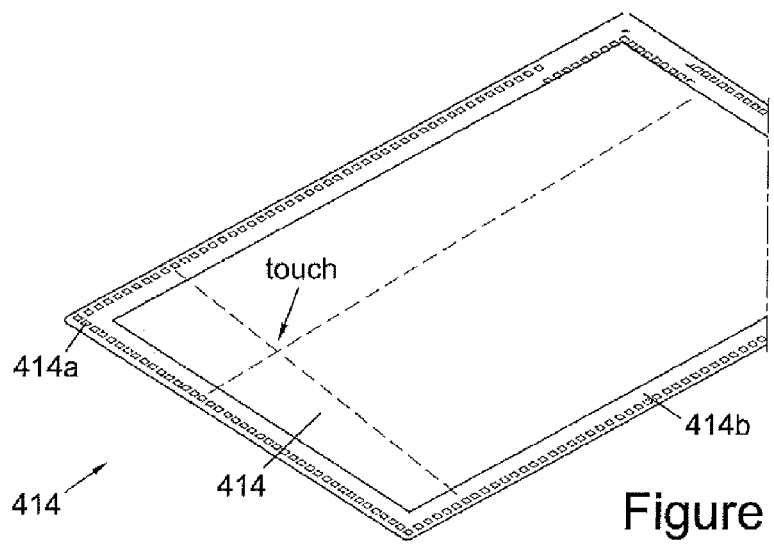
FIG. 5 shows a front window for the device of FIG. 4, incorporating a touch-sensor.

Referring next to FIGS. 5 to 13, these show perspective views of layers illustrated in the cross-section of FIG. 4. Thus FIG. 5 shows plastic front window 414 which protects the display medium and, where present, the colour filter array. This window has a plurality of pads 414a around the edge which connect to tracks on the touch sensor FLM (fine line metal) in the case of a capacitive sensor. In embodiments the fine line metal has a width in the range 2-5 μm. The window 414 provides a narrow border 414b around the active display area.

Figure 6:
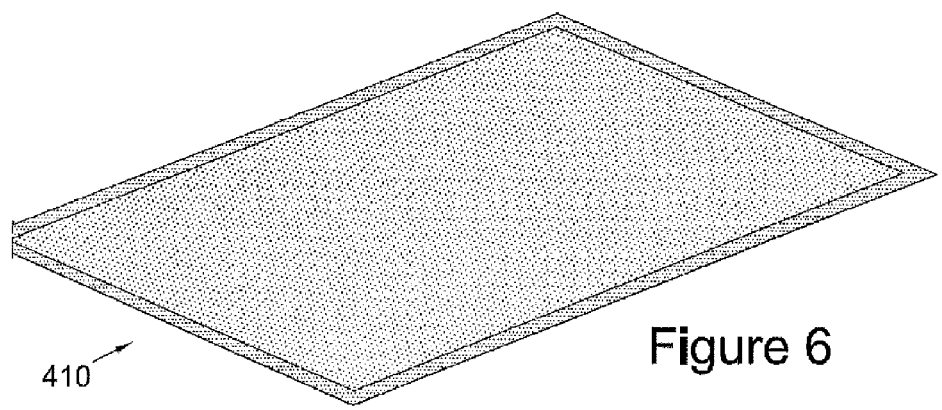
FIG. 6 shows a colour filter array for the device at FIG. 4.
Figure 7:
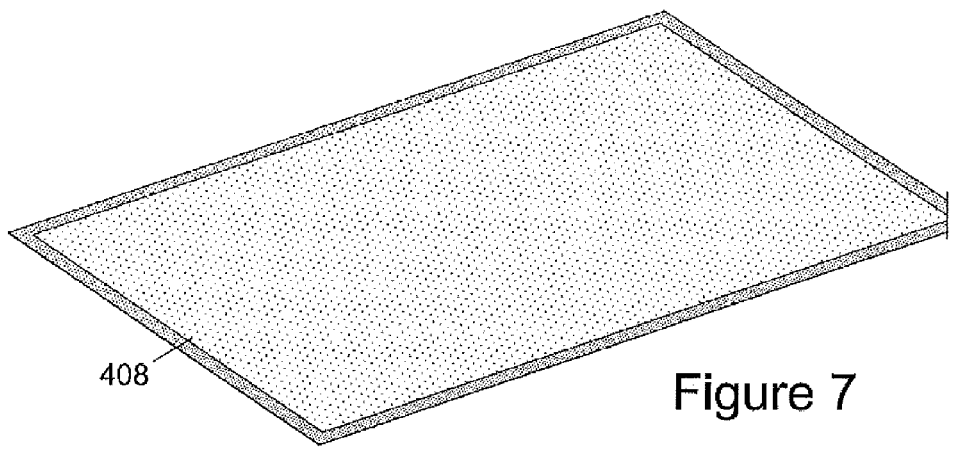
FIG. 7 shows a display media layer for the device at FIG. 4.
Figure 8:
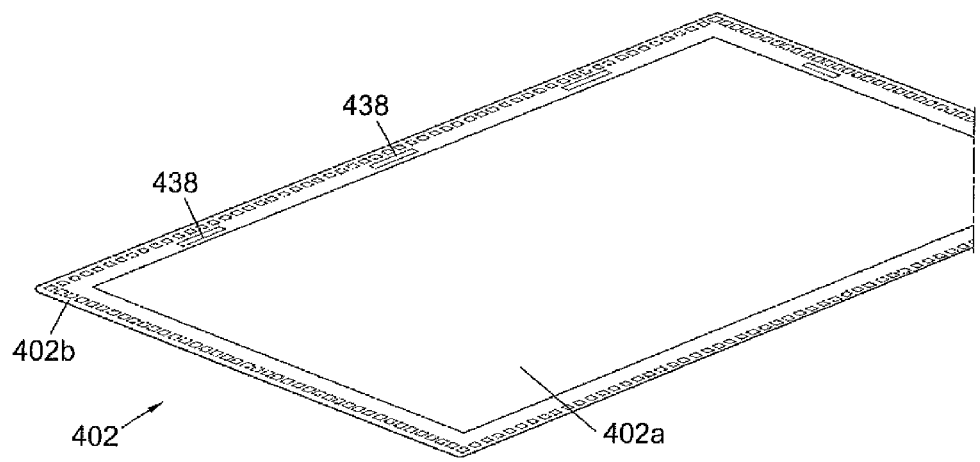
FIG. 8 shows a substrate/backplane layer for the device at FIG. 4 mounting display interface electronics.

FIG. 6 shows a plan view of the colour filter array 410, again with a narrow border. In embodiments this may provide a regular pattern of red, green, blue and white colours. FIG. 7 shows the display medium 408, with the active area of the media substantially following the entire available area. FIG. 8 shows substrate 402 having an active backplane area 402a for driving pixels of the display medium 408. Substrate 402 is provided with pads 402b around the edge to carry touch signals between the touch electrodes of window 414 and touch sensing circuitry on PCB 422. Substrate 402 also bears a plurality of display driver integrated circuits 438, mounted on substrate 402 using chip-on-plastic technology. Connections to these when made, for example, by other pads (now shown).

Figure 9:
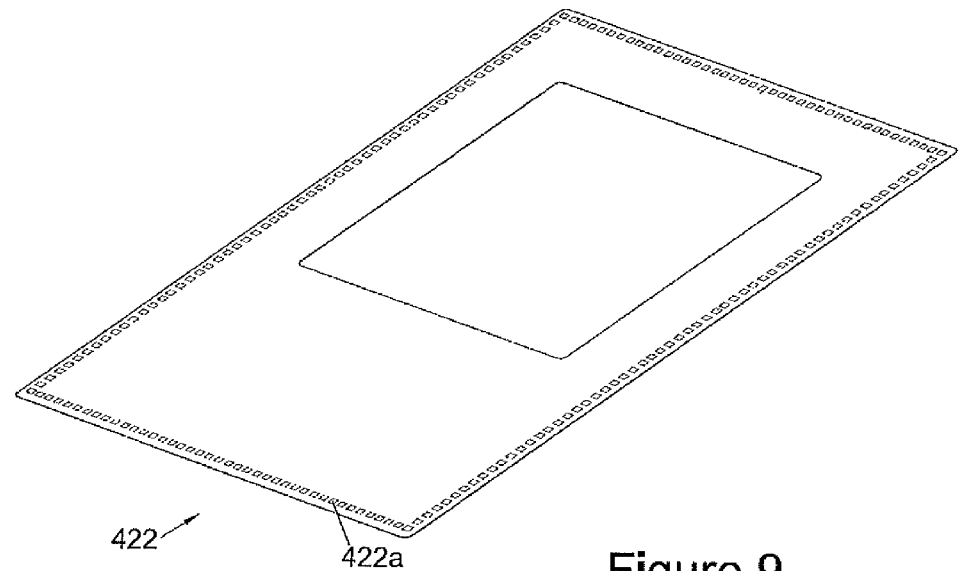
FIG. 9 shows a front side of a flexible PCB for the device at FIG. 4.

FIG. 9 shows the front (display-facing) face of flexible PCB 422, illustrating pads 422a around the border which connect to the display/touch sensing module via an isotropic conductive film.

Figure 10:
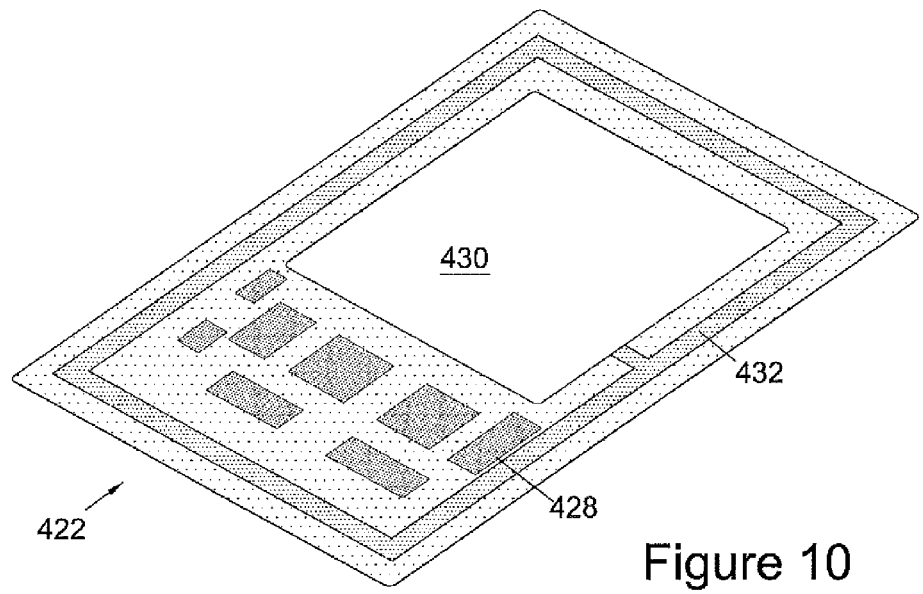
FIG. 10 shows a rear face of the flexible PCB at FIG. 9.

FIG. 10 shows, schematically, the rear face of PCB 422, illustrating the components 428, battery location 430 and inductive loop 432.

Figure 11:
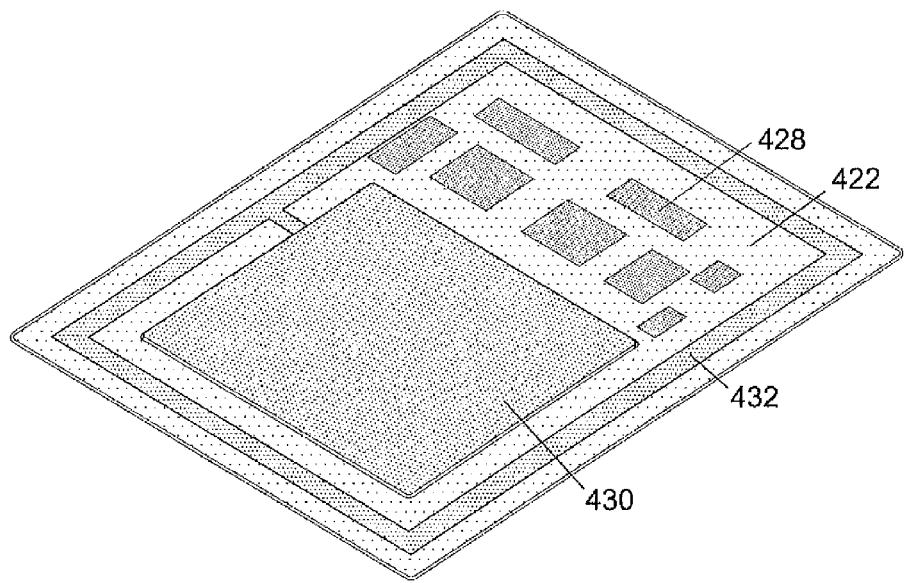
FIG. 11 shows a view of the rear of the device at FIG. 4 when the back cover is not present.

FIG. 11 is a similar illustration to FIG. 10 showing the flexible battery 430 in position. The electronic components 428 include, in embodiments a single chip processor, a display engine, and Bluetooth™/near-field communications. As illustrated the battery 430 may be recharged by holding the device over an inductive charging pad, but in alternative approaches a capacitive charge electrode may be employed for capacitive charging.

Figure 12:
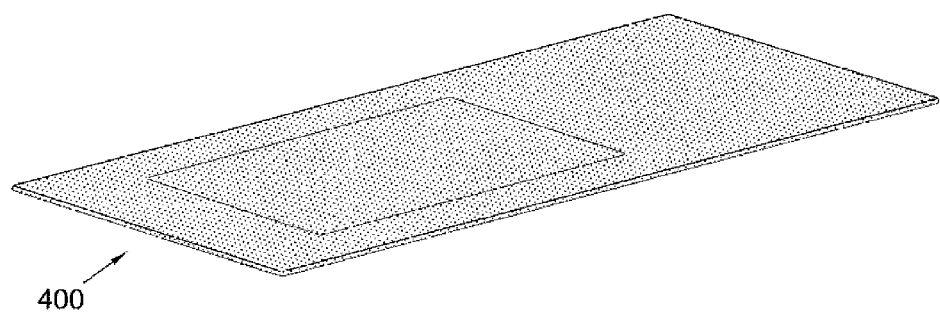
FIG. 12 shows a rear view of the device at FIG. 4.
Figure 13:
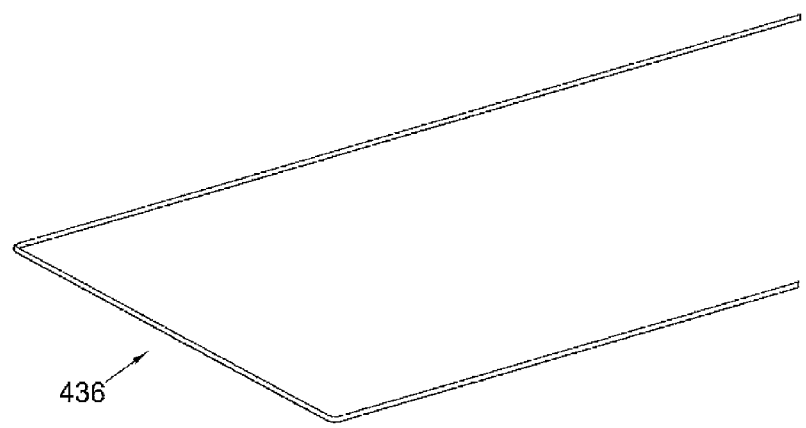
FIG. 13 shows an edge profile of the device at FIG. 4.

FIG. 12 shows a rear view of the device 400, illustrating the thinness of the device—in embodiments the device is of order 2 mm thick. FIG. 13 shows an edge profile of the device formed by encapsulant 436.

Figure 14:
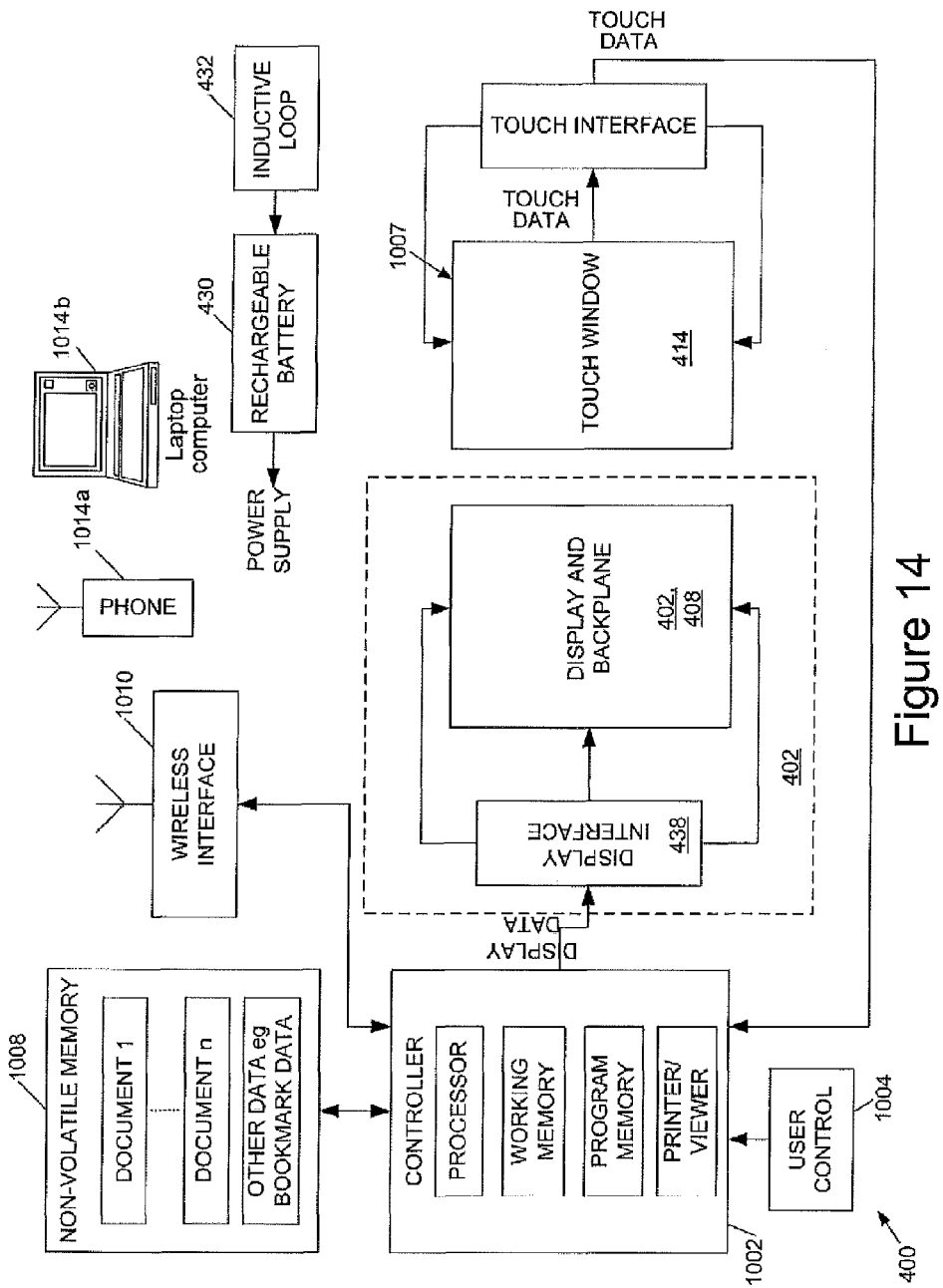
FIG. 14 shows a block diagram of the device at FIG. 4.

FIG. 14 shows a block diagram of the electronics of the device of FIG. 4. The device comprises a controller 1002 including a processor, for example an ARM™ device, working memory and program memory coupled to one or more display interface integrated circuits 438 for driving the electrophoretic/electrofluidic display 408. One or more touch interface integrated circuits 1006 interface with the touch electrodes on front window 414 to provide touch data to controller 1002.

The program memory in embodiments stores processor control code to implement functions including an operating system, various types of wireless interface, document retrieval, storage, annotation (via the touch interface) and export from the device. The stored code also includes code 1003 to implement a document viewer/'printerless printing' function, for example interfacing with corresponding driver code on a 'host' device.

The controller 1002 interfaces with non-volatile memory, for example Flash memory, for storing one or more documents for display and, optionally, other data such as user bookmark locations and the like. Optionally a mechanical user control 1004 may also be provided.

A wireless interface 1010, for example a Bluetooth™ or WiFi interface is provided for interfacing with a consumer electronic device such as a phone 1014a, laptop 1014b or the like.

As previously mentioned inductive loop 432 is used to charge the chargeable battery 430 which has associated circuitry for providing a regulated power supply to the system.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A flexible electronic reading device, the device comprising a display part and a handle, wherein said display part comprises:
   a display backplane; and
   a display mounted over said display backplane;
   wherein said handle is located at one edge of said display backplane and contains display interface electronics for said display; and
   wherein said display part of said electronic reading device comprises a unitary, continuous structure lacking a separate housing;
   wherein said display and display backplane comprises at least one hinge to enable one portion of said display to be folded behind another.

2. A flexible electronic reading device as claimed in claim 1 wherein said electronic reading device lacks an internal or external stiffening frame.

3. A flexible electronic reading device as claimed in claim 1 wherein said display backplane comprises an array of organic active matrix pixel driver circuitry on a plastic substrate, wherein said plastic substrate extends beyond a border of said display, and wherein at least a portion of said display interface electronics is fabricated on said plastic substrate.

4. A flexible electronic reading device as claimed in claim 3 wherein said plastic substrate extends beyond said border of said display on at least three sides, a handle side adjacent said handle, and two adjacent sides adjacent to said handle side, wherein said display interface electronics includes a plurality of pixel driver chips mounted at said handle side of said plastic substrate, and further comprising two sets of tracks on said plastic substrate between said pixel driver chips and said display, one running along each of said adjacent sides.

5. A flexible electronic reading device as claimed in claim 4 wherein said plurality of pixel driver chips comprises at least one gate driver and at least two drain/source drivers, and wherein said gate driver is connected to driver gate lines extending away from said handle side generally parallel to said adjacent sides, and wherein each of said drain/source drivers is connected to drive a respective set of drain source lines extending, generally parallel to said handle side, inwards from respective ones of said adjacent edges.

6. A flexible electronic reading device as claimed in claim 1 wherein said display and display backplane comprises at least two hinges, configured to hinge in opposite rotational directions, so that the display and display backplane is Z-foldable such that, when folded, one region of a surface of the display is located between two adjacent regions of the surface of the display.

7. A flexible electronic reading device as claimed in claim 6 wherein said display interface electronics comprises first drivers for control lines of said display and second drivers for data lines of said display, wherein said second drivers comprise first and second subsets of second drivers, wherein said data lines of said display comprise first and second set of data lines extending inwards from respective first and second borders of said display, wherein said first and second borders comprise borders running generally parallel to said hinges, and wherein said first and second subsets of second drivers are connected to drive respective said first and second sets of data lines.

\* \* \* \* \*